United States Patent [19]

Berke et al.

[11] 4,303,868
[45] Dec. 1, 1981

[54] SAWTOOTH WAVEFORM GENERATING CIRCUIT FOR UTILIZATION IN A HELMET MOUNTED DISPLAY

[75] Inventors: Herbert Berke, Maitland; John H. Allen, Winter Park; Joseph R. Owen, Orlando, all of Fla.

[73] Assignee: The United States of America as represented by the Secretary of the Navy, Washington, D.C.

[21] Appl. No.: 167,275

[22] Filed: Jul. 10, 1980

[51] Int. Cl.³ .................. H01J 29/70; H01J 29/72
[52] U.S. Cl. ................................... 315/364; 358/93
[58] Field of Search ............... 315/364, 403, 408, 409, 315/410; 350/174; 358/93, 103; 351/7; 89/41 EA, 41 L

[56] References Cited

U.S. PATENT DOCUMENTS 3,885,095 5/1975 Wolfson et al. ................... 358/93

Primary Examiner—Theodore M. Blum
Attorney, Agent, or Firm—Richard S. Sciascia; Robert W. Adams; David S. Kalmbaugh

[57] ABSTRACT

A sawtooth waveform circuit for a cathode ray tube display apparatus or the like is disclosed for providing a sawtooth waveform signal in synchronization with the uniformly spaced pulses of a sync signal. A direct current voltage is supplied to an integrator which produces a ramp voltage. Switching means responsive to each pulse of the sync signal shorts the integrator so as to cause the ramp voltage to appear at the output of the integrator as a sawtooth waveform signal. A summing amplifier amplifies the sawtooth waveform signal, and then combines the amplified sawtooth waveform signal with a variable direct current voltage generated by a head tracker so as to provide at the output of the summing amplifier a raster drive signal.

13 Claims, 2 Drawing Figures

SAWTOOTH WAVEFORM GENERATING CIRCUIT FOR UTILIZATION IN A HELMET MOUNTED DISPLAY

BACKGROUND OF THE INVENTION

1. Field of the Invention

This invention relates generally to electronic sweep generating circuits. In particular, this invention relates to an electronic sweep generating circuit for producing a sawtooth waveform signal to be utilized by a helmet mounted display system.

2. Description of the Prior Art

Sweep generators for providing a sawtooth waveform signal to drive the scanning coils of a cathode ray tube or the like are well known in the prior art. The sawtooth waveform signal produced by such sweep generators is generally synchronized with an input sync signal so as to provide at the output thereof a ramp voltage having a constant slope or a constant peak.

Prior art sweep generators customarily generate sawtooth waveform signals by charging a sweep capacitor at a uniform rate and then discharging the capacitor in synchronism with an input sync signal. A controllable current source supplies charge to the sweep capacitor to provide the ramp voltage. The ramp voltage is continuously integrated and compared with a reference voltage and the difference between the integrated sweep voltage and the reference voltage is used to control the current source.

These sweep generators of the prior art, while satisfactory for their intended purpose of producing a sawtooth waveform signal to drive the scanning coils of a cathode ray tube, have some inherent shortcomings. In particular, the aforementioned sweep generators are either limited to a narrow range of input frequencies or limited to a very slow response time. In addition, such sweep generators of the prior art have been found unsatisfactory for use in a helmet mounted display system or the like which displays for a trainee pilot a visual image upon a retroreflective display screen.

SUMMARY OF THE INVENTION

The subject invention overcomes some of the disadvantages of the prior art, including those mentioned above, in that it comprises a relatively simple sawtooth waveform generator for utilization in a helmet mounted display or the like.

Included in the subject invention is a signal generator for producing a sync signal having a series of uniformly spaced pulses, a direct current voltage source for producing a direct current voltage, and an integrator for providing a linear ramp voltage in response to the direct current voltage. A switching transistor shorts the integrator whenever a pulse of the sync signal is supplied to the base thereof so as to form a sawtooth waveform signal at the output of the integrator.

A summing amplifier amplifies the sawtooth waveform signal to a predetermined voltage level, and then combines the amplified sawtooth waveform signal with a variable direct current voltage generated by a head tracker so as to provide at the output thereof a raster drive signal. The raster drive signal is, in turn, supplied to the input of a deflection system so as to position a visual image displayed thereby.

DESCRIPTION OF THE PREFERRED EMBODIMENT

Figure 1:
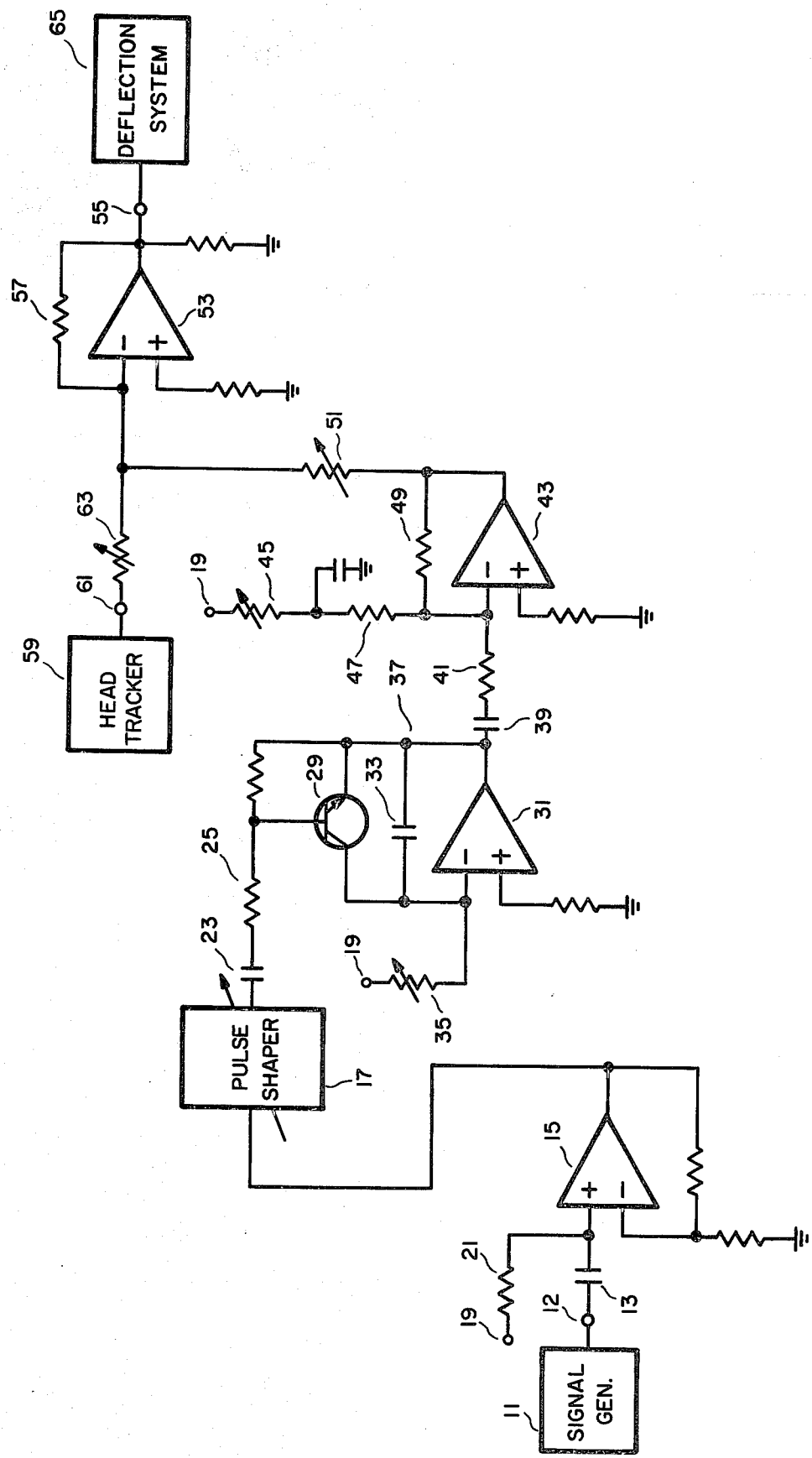
FIG. 1 is an electrical schematic of the sawtooth waveform generator circuit which constitutes the subject invention.

The preferred embodiment of the subject invention will now be discussed in some detail in conjunction with all of the figures of the drawings wherein like parts are designated by like reference numerals, insofar as it is possible to do so.

Figure 2:
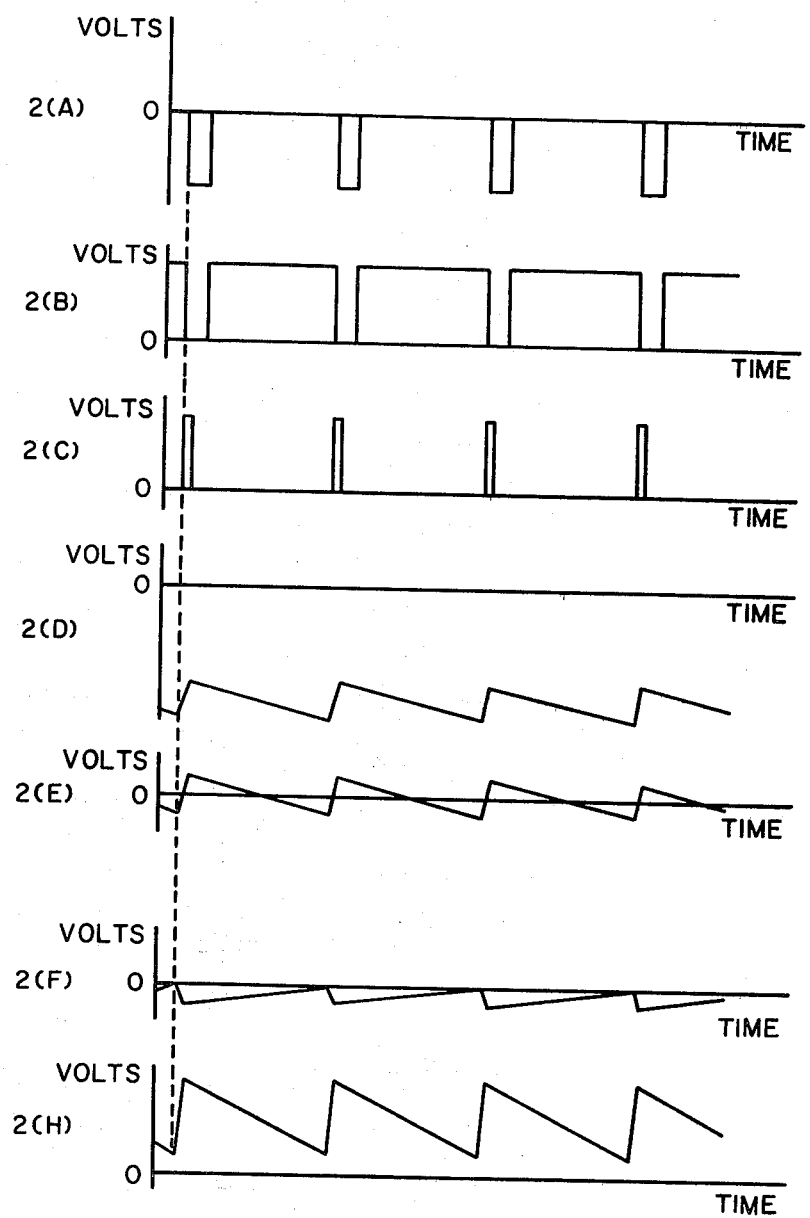
FIG. 2 is a graphical representation of various pulses which occur at the outputs of some of the elements of FIG. 1.

Referring now to FIG. 1, there is shown a signal generator 11 which produces at the output thereof a sync signal, such as that illustrated in FIG. 2(A).

At this time it may be noteworthy to mention that signal generator 11 may be any well known, conventional, and commercially available signal generator which provides at the output thereof a sync signal. In particular, signal generator 11 may be a computer image generator, not shown, or a camera controller, not shown, such as disclosed in U.S. patent application entitled Computer Generated Image Simulator, by John Allen, Herbert Berke, and Joseph R. Owen, Ser. No. 167,276, filed concurrently with this application.

The output of signal generator 11 is connected through an input terminal 12 and a capacitor 13 to the positive input of a voltage level shifting amplifier 15, with the output thereof connected to the input of an adjustable pulse shaper 17 which, for instance, may be a Model 9601 one-shot multivibrator manufactured by Fairchild, Inc., of Mountain View, Calif. The output of a direct current voltage source 19 is connected through a resistor 21 to the positive input of voltage level shifting amplifier 15.

The output of adjustable pulse shaper 17 is connected through a capacitor 23 and a resistor 25 to the base of an NPN switching transistor 29, the collector of which is connected to the negative input of an operational amplifier 31, and the emitter of which is connected to the output of operational amplifier 31. Effectively connected between the negative input and the output of operational amplifier 31 is a capacitor 33.

Direct current voltage source 19 is connected through a variable resistor 35 to the negative input of operational amplifier 31, the combination of which with capacitor 33 forms an integrator 37.

The output of operational amplifier 31 is connected to the first terminal of a blocking capacitor 39, the second terminal of which is connected through a resistor 41 to the negative input of a summing amplifier 43. Direct current voltage source 19 is connected through a variable resistor 45 and a resistor 47 to the negative input of summing amplifier 43, while a resistor 49 is connected between the negative input and the output of summing amplifier 43.

The output of summing amplifier 43 is connected through a variable resistor 51 to the negative input of a summing amplifier 53, the output of which is connected to an output terminal 55. Connected between the negative input and the output of summing amplifier 53 is a resistor 57.

A head tracker 59 is connected through an input terminal 61 and a variable resistor 63 to the negative input of summing amplifier 53. Head tracker 59 may be a head tracker such as that disclosed in the aforementioned U.S. patent application, Ser. No. 167,276, which provides at the output thereof a variable direct current voltage.

Effectively connected to output terminal 55 is a deflection system 65. Deflection system 65 may be, for example, a cathode ray tube display such as that disclosed in U.S. patent application, Ser. No. 167,276.

The operation of the subject invention will now be discussed in conjunction with all of the figures of the drawing.

Referring to FIG. 1, signal generator 11 produces at the output thereof, as mentioned above, the sync signal of FIG. 2(A) which has a series of uniformly spaced pulses. The frequency of the sync signal of FIG. 2(A) may be that of the standard television vertical or horizontal scanning rates for either a 525 or a 1025 line television system.

The sync signal of FIG. 2(A) is supplied to the positive input of amplifier 15, which uniformly shifts the voltage level of each of the pulses of the sync signal of FIG. 2(A) so as to provide a signal similar to that of FIG. 2(B) at the output thereof.

The signal of FIG. 2(B) is supplied to the input of pulse shaper 17 which narrows the pulse width of each pulse of the aforementioned signal to a predetermined time period. This, in turn, results in a signal, similar to that illustrated in FIG. 2(C), being provided by pulse shaper 17 to the base of switching transistor 29.

Direct current voltage source 19 supplies a constant direct current voltage to capacitor 33 so as to charge capacitor 33 at a uniform rate such that a linear ramp voltage, not shown, will appear at the output of amplifier 31. As mentioned above, the signal of FIG. 2(C) is supplied to the base of switching transistor 29 so as to turn on switching transistor 29 for the pulse duration of each pulse of the signal of FIG. 2(C). This, in turn, short circuits capacitor 33 so as to discharge capacitor 33, which results in a sawtooth waveform signal similar to that of FIG. 2(D) appearing at the output of integrator 37.

Capacitor 39 removes from the sawtooth waveform signal of FIG. 2(D) the direct current component thereof such that a sawtooth waveform signal similar to that illustrated in FIG. 2(E) is supplied to the negative input of summing amplifier 43.

Direct current voltage source 19 supplies through variable resistor 45 and resistor 47 to the negative input of summing amplifier 43 a direct current voltage which is then summed with the sawtooth waveform signal of FIG. 2(E) by amplifier 47 so as to form at the output thereof a signal similar to that shown in FIG. 2(F).

At this time it may be noteworthy to mention that variable resistor 45 is preset such that the ramp of the sawtooth waveform signal of FIG. 2(F) will rise to a predetermined negative voltage level and then timely drop to a voltage level of zero volts.

The sawtooth waveform signal of FIG. 2(F) is then supplied to the negative input of summing amplifier 53 through variable resistor 51. Variable resistor 51 is preset such that summing amplifier 53 amplifies the sawtooth waveform signal of FIG. 2(F) so as to increase the voltage gain thereof by a predetermined factor such as, for example, five.

Head tracker 59 produces at the output thereof a variable direct current voltage, the voltage level of which varies with the movement of the head and the eyes of a trainee pilot, not shown, as is discussed more fully in U.S. patent application, Ser. No. 167,276. The variable direct current voltage provided by head tracker 59 is then supplied to the negative input of summing amplifier 53 which sums the aforementioned direct current voltage signal with the sawtooth waveform signal of FIG. 2(F) so as to provide at the output thereof a raster drive signal similar to the signal illustrated in FIG. 2(H).

At this time it may be noted that whenever the voltage level of the direct current voltage provided by head tracker 59 changes, due to the movement of the head of the aforementioned trainee pilot, the voltage level of the raster drive signal of FIG. 2(H) will uniformly shift in accordance therewith.

The raster drive signal of FIG. 2(H) is then supplied to the input of deflection system 65, so as to position a visual image displayed thereby in accordance with the movement of the head of the trainee pilot, as is discussed more fully in U.S. patent application, Ser. No. 167,276.

From the foregoing, it may readily be seen that the subject invention comprises a new, unique, and exceedingly useful sawtooth waveform generating circuit which constitutes a considerable improvement over the known prior art. Obviously, many modifications and variations of the present invention are possible in light of the above teachings. It is, therefore, to be understood that within the scope of the appended claims the invention may be practiced otherwise than as specifically described.

What is claimed is:

1. A sawtooth waveform generating circuit for utilization in a helmet mounted display comprising, in combination:

pulse source means having an output for generating a sync signal having a series of uniformly spaced pulses, the frequency of which is a predetermined value;

pulse shaping means having an input connected to the output of said pulse source means and an output for narrowing the pulse width of each pulse of said sync signal to a predetermined time period;

first voltage source means having an output for generating a constant direct current voltage;

integrating means having an input connected to the output of said first voltage source means for providing at the output thereof a linear ramp voltage in response to the constant direct current voltage provided by said first voltage source means, said linear ramp voltage having a predetermined maximum amplitude;

switching means having a first terminal connected to the output of said pulse shaping means, a second terminal connected to the input of said integrating means, and a third terminal connected to the output of said integrating means for shorting said integrating means each time one of the pulses of said sync signal is applied to the first terminal thereof such that said linear ramp voltage will drop to a predetermined minimum amplitude so as to form a sawtooth waveform signal, said sawtooth waveform signal having a frequency identical to the frequency of said sync signal, and a direct current component therein;

coupling means having an input connected to the output of said switching means and an output for removing the direct current component from said sawtooth waveform signal;

means having a first input connected to the output of said coupling means, a second input connected to the output of said first voltage source means, and an output for variably shifting the voltage level of said sawtooth waveform signal;

second voltage source means having an output for providing a variable direct current voltage; and summing means having a first input connected to the output of said voltage level shifting means, a second input connected to the output of said second voltage source means, and an output for amplifying said sawtooth waveform signal, and for combining said amplified sawtooth waveform signal and the variable direct current voltage provided by said second voltage source means so as to form a raster drive signal at the output thereof.

2. The sawtooth waveform generator of claim 1, wherein said pulse shaping means is a retriggerable monostable multivibrator.

3. The sawtooth waveform generator of claim 1, wherein said integrating means comprises:
   a variable resistor having a first terminal connected to the output of said voltage source means and a second terminal;
   an operational amplifier having an input connected to the second terminal of said variable resistor, and an output; and
   a capacitor connected between the input and output of said operational amplifier.

4. The sawtooth waveform generator of claim 1, wherein said coupling means comprises a capacitor.

5. The sawtooth waveform generator of claim 1, wherein said level shifting means comprises:
   a summing amplifier having an input connected to the output of said coupling means, and an output; and
   a variable resistor having a first terminal connected to the output of said first voltage source means, and a second terminal connected to the input of said summing amplifier.

6. The sawtooth waveform generator of claim 1, wherein said summing means comprises:
   a first variable resistor having a first terminal connected to the output of said level shifting means and a second terminal;
   a summing amplifier having an input connected to the second terminal of said first variable resistor; and
   a second variable resistor having a first terminal connected to the output of said second voltage source means and a second terminal connected to the input of said summing amplifier.

7. The sawtooth waveform generator of claim 1, further characterized by a cathode ray tube display apparatus having an input connected to the output of said summing means.

8. A sawtooth voltage generator comprising, in combination:
   a signal generator having an output;
   a voltage level shifting amplifier having an input connected to the output of said signal generator and an output;
   a pulse shaper having an input connected to the output of said voltage level shifting amplifier and an output;
   a switching transistor having a base connected to the output of said pulse shaper, an emitter, and a collector;
   an integrator having an input connected to the collector of said switching transistor, and an output connected to the emitter of said switching transistor;
   a direct current voltage source having an output connected to the input of said integrator;
   a blocking capacitor having a first terminal connected to the output of said integrator, and a second terminal;
   a first variable resistor having a first terminal connected to the output of said direct current voltage source, and a second terminal connected to the second terminal of said blocking capacitor;
   a first summing amplifier having an input connected to the second terminal of said blocking capacitor, and an output;
   a second variable resistor having a first terminal connected to the output of said first summing amplifier and a second terminal;
   a third variable resistor having a first terminal connected to the second terminal of said second variable resistor, and a second terminal;
   a second summing amplifier having an input connected to the second terminal of said second variable resistor, and an output.

9. The sawtooth voltage generator of claim 8, wherein said pulse shaper is a retriggerable monostable multivibrator.

10. The sawtooth voltage generator of claim 8, wherein said switching transistor is an NPN transistor.

11. The sawtooth voltage generator of claim 8, wherein said integrator comprises:
    a variable resistor having a first terminal connected to the output of said direct current voltage source and an output;
    an operational amplifier having an input connected to the second terminal of said variable resistor and an output; and a capacitor connected between the input and output of said operational amplifier.

12. The sawtooth voltage generator of claim 8, further characterized by means effectively connected to the second terminal of said third variable resistor for providing a variable direct current voltage.

13. The sawtooth voltage generator of claim 8, further characterized by a cathode ray tube display apparatus having an input connected to the output of said second summing amplifier.

* * * * *